(12) United States Patent
Raychaudhuri et al.

(10) Patent No.: US 8,241,467 B2
(45) Date of Patent: Aug. 14, 2012

(54) MAKING A CATHODE STRUCTURE FOR OLEDS

(75) Inventors: Pranab K. Raychaudhuri, Rochester, NY (US); Joseph K. Madathil, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 928 days.

(21) Appl. No.: 10/915,224

(22) Filed: Aug. 10, 2004

(65) Prior Publication Data
US 2006/0035015 A1 Feb. 16, 2006

(51) Int. Cl.
C23C 14/00 (2006.01)
C23C 14/32 (2006.01)
C23C 8/00 (2006.01)
B05D 5/06 (2006.01)
B05D 5/12 (2006.01)
B05D 3/06 (2006.01)

(52) U.S. Cl. ......... 204/192.26; 204/192.14; 204/192.16; 204/192.27; 204/192.28; 204/192.29; 427/69; 427/166; 427/566; 427/585

(58) Field of Classification Search .......... 257/40, 257/481; 313/506; 428/432, 690; 438/22; 204/192.16, 192.17, 192.26, 192.29, 192.14, 204/192.27, 192.28; 427/69, 166, 566, 585
See application file for complete search history.

(56) References Cited

U.S. PATENT DOCUMENTS

| | | | |
|---|---|---|---|
| 4,769,292 A | 9/1988 | Tang et al. | 428/690 |
| 4,885,211 A | 12/1989 | Tang et al. | 428/457 |
| 5,703,436 A * | 12/1997 | Forrest et al. | 313/506 |
| 5,707,745 A * | 1/1998 | Forrest et al. | 428/432 |
| 6,551,725 B2 | 4/2003 | Raychaudhuri et al. | 428/690 |
| 6,569,697 B2 * | 5/2003 | Lu et al. | 438/22 |
| 6,579,629 B1 | 6/2003 | Raychaudhuri et al. | 428/690 |
| 6,593,690 B1 * | 7/2003 | McCormick et al. | 313/506 |
| 6,893,743 B2 * | 5/2005 | Sato et al. | 428/690 |
| 6,917,158 B2 * | 7/2005 | Lee et al. | 313/506 |
| 7,029,767 B2 * | 4/2006 | Nakamata | 428/690 |
| 7,061,011 B2 * | 6/2006 | Forrest et al. | 257/40 |
| 7,553,355 B2 * | 6/2009 | Torres et al. | 96/117.5 |
| 2003/0234608 A1 * | 12/2003 | Lee et al. | 313/504 |
| 2004/0084743 A1 * | 5/2004 | VanBuskirk et al. | 257/481 |

(Continued)

FOREIGN PATENT DOCUMENTS

DE 198 07 370 7/1999

(Continued)

OTHER PUBLICATIONS http://dictionary.reference.com/browse/metal [Accessed on Apr. 2, 2009].*
Liao et al., Appl. Phys. Lett. 75, 1619 (1999).
Hung et al., J. Appl. Phys. 86, 4607 (1999).

(Continued)

*Primary Examiner* — Jonathan Johnson
*Assistant Examiner* — Michael Band
(74) *Attorney, Agent, or Firm* — McKenna Long & Aldridge LLP

(57) ABSTRACT

A method of making a cathode structure for an OLED provided over organic layers includes evaporating a first layer over the organic layers, such layer including a metal or metal alloy whose work function is less that 4.0 eV, or a material including an electron-injecting dopant and a reactive metal; depositing at least one second layer of an inorganic material over the first layer to form a buffer structure with the first layer; and sputtering a protective layer of a metal or metal alloy provided over the buffer structure.

10 Claims, 1 Drawing Sheet

U.S. PATENT DOCUMENTS

2004/0238814 A1* 12/2004 Mizusaki et al. .............. 257/40

FOREIGN PATENT DOCUMENTS

| EP | 0 876 086 | 11/1998 |
| EP | 0 880 305 | 11/1998 |
| EP | 0 880 307 | 11/1998 |
| EP | 0 982 783 | 3/2000 |

OTHER PUBLICATIONS

Parthasarathy et al., Appl. Phys. Lett. 72, 2138 (1998).
P.K. Raychaudhuri and J.K. Madathil, "Fabrication of Sputtered Cathodes for Organic Light-Emitting Diodes Using Transparent Buffer", Proceedings of the 7th Asian Symposium on Information Display (Sep. 2-4, Singapore) Digest, paper 50, vol. 32, pp. 55-58, 2002.

* cited by examiner

MAKING A CATHODE STRUCTURE FOR OLEDS

FIELD OF THE INVENTION

The present invention relates to a method of making a cathode structure for OLED devices.

BACKGROUND OF THE INVENTION

An organic electroluminescent (OEL) device, alternately known as organic light-emitting diode (OLED), is useful in flat-panel display applications. This light-emissive device is attractive because it can be designed to produce red, green, and blue colors with high luminance efficiency, operable with a low driving voltage of the order of a few volts and viewable from oblique angles. These unique attributes are derived from a basic OLED structure comprising a multilayer stack of thin films of small-molecule organic materials sandwiched between an anode and a cathode. Tang et al. in commonly assigned U.S. Pat. Nos. 4,769,292 and 4,885,211 have disclosed such a structure. The common electroluminescent (EL) medium is comprised of a bilayer structure of a hole-transport layer (HTL) and an electron-transport layer (ETL), typically on the order of a few tens of nanometer (nm) thick for each layer. The anode material is typically optically transparent and the cathode is typically a metallic thin film. When an electrical potential difference is applied at the electrodes, the injected carriers (hole at the anode and electron at the cathode) migrate towards each other through the EL medium, and a fraction of them recombines in the emitting layer (EML) in a region close to the HTL/ETL interface, to emit light. The intensity of electroluminescence is dependent on the EL medium, drive voltage, and charge injecting nature of the electrodes. However, a significant fraction of generated light is trapped within the device in waveguiding modes and only a small fraction emerges out of the device. The light generated within the device emits in all directions. The light emitted toward the anode at less than the critical angle passes through the anode and substrate to the viewer, and the light emitted in the opposite direction is reflected at the cathode and passes through the substrate, enhancing the viewing intensity. A high-transparency substrate and anode and a high-reflectivity cathode are thus preferred.

Selection of electrode materials is also based on work functions. Indium tin oxide (ITO) is most commonly used as the anode because it is highly transparent and conductive and because it has a high work function. Mg:Ag alloys are generally used as electron-injecting contacts because they have lower work functions and highly reflective. Lithium containing reflective alloys such as Al:Li or Al on LiF also provides efficient electron injection to the EL medium.

The substrate generally used for OLEDS is glass. The ITO anode layer is most commonly sputtered on the glass substrate held at high temperature. The EL medium comprising organic layers are fabricated on the ITO glass substrates using a high vacuum deposition method. The cathode is fabricated by depositing a metallic layer over the organic medium also using the high vacuum method. Among the deposition methods for the cathode layer, resistive heating or electron-beam heating has been found to be most suitable because they do not cause damage to the organic layers. However, it would be highly desirable to avoid these methods for cathode fabrication. This is because these processes are inefficient. In order to realize low cost manufacturing, a robust and proven high-throughput process should be adopted and developed specifically for the OLEDS. Sputtering has been used as a method of choice for thin film deposition in many industries. Conformal, dense and adherent coatings, short cycle time, low maintenance of coating chamber, and efficient use of materials are some of the benefits of sputtering.

Sputtering is not commonly practiced for fabrication of the OLED cathodes because of the damage inflicted on the organic layers and the degradation of device performance. Sputter deposition takes place in a high energy and complex environment that is comprised of energetic neutrals, electrons, positive and negative ions, and emissions from the excited states that can degrade the organic layers upon which the cathode is deposited.

Liao et al. in Appl. Phys. Lett. 75, 1619 (1999) investigate, using x-ray and ultraviolet photoelectron spectroscopies, the damages induced on Alq surfaces by 100 eV $Ar^+$ irradiation. The core level electron density curves show that some N—Al and C—O—Al bonds in Alq molecules were broken. The valance band structure was also tremendously changed implying the formation of a metal-like conducting surface. The reference suggests that this would cause nonradiative quenching in OLEDS when electrons are injected into the Alq layer from the cathode and also would result in electrical shorts.

During sputter deposition of the cathode, the Alq surface is subjected to high doses of $Ar^+$ bombardments at several hundred volts. As shown by Hung et al. in J. Appl. Phys. 86, 4607 (1999), a dose only of $9 \times 10^{14}/cm^2$ alters the valance band structure. Therefore, sputtering a cathode on Alq surface in Ar atmosphere is expected to degrade the device performance.

Sputtering damage is controllable, to some extent, by properly selecting the deposition parameters. In EP 0 876 086 A2, EP 0 880 305 A1, and EP 0 880 307 A2, Nakaya et al. of TDK Corporation disclosed a method of depositing a cathode by a sputtering technique. After depositing the organic layers, with vacuum still kept, the devices were transferred from the evaporation to a sputtering chamber wherein the cathode layer was deposited directly on the electron-transport layer. The cathode was an Al alloy comprised of 0.1-20% Li that additionally contained at least one of Cu, Mg, and Zr in small amounts, and in some cases had a protective overcoat. The OLED devices thus prepared used no buffer layer. Grothe et al. in DE 198 07 370 C1 also disclose a sputtered cathode of an Al:Li alloy, which had relatively high Li concentration and having one or more additional elements chosen from Mn, Pb, Pd, Si, Sn, Zn, Zr, Cu, and SiC. In all of the examples no buffer was used, yet electroluminescent was produced at lower voltages. Sputtering damage was controlled by employing a low deposition rate. By lowering sputtering power it is believed that damage inflicted on the organic layers can be reduced. At low power, however, the deposition rate can be impracticably low and the advantages of sputtering are reduced or even neutralized.

To reduce damage during high speed sputtering of cathodes, a protective coating on the electron-transport layer can be useful. The protective layer, alternately termed as the buffer layer, should be robust to be effective. Parthasarathy et al. in Appl. Phys. Lett. 72, 2138 (1998) report an application of a buffer layer including copper phthalocyanine (CuPc) and zinc phthalocyanine (ZnPc) during sputtering deposition of a metal free cathode. The buffer layer prevented damage to the underlying organic layers during the sputtering process. Hung et al. in J. Appl. Phys. 86, 4607 (1999) disclose the application of CuPc buffer layers that permit high-energy deposition of alloy cathodes. The cathode contained a low work function component, Li, which was believed to diffuse through the buffer layer and provided an electron-injecting layer between the electron-transport layer and the buffer layer. Nakaya et al. in EP 0 982 783 A2 disclose a cathode of Al:Li alloy. The cathode was prepared by sputtering using a buffer layer constructed of a porphyrinic or naphthacene compound that was deposited between the electron-transport layer and the cathode. The device containing the sputtered electrode exhibited low drive voltage, high efficiency, and retarded dark spot growth.

Raychaudhuri et al. disclose in U.S. Pat. No. 6,579,629 a high speed sputtering process for fabrication of cathodes. On the ETL was deposited by evaporation a buffer structure comprising two layers, one buffer layer containing an alkali metal halide, and a second buffer layer containing a metal phthalocyanine. An alloy cathode such as Ag or Al, containing an alkali metal such as Li, was deposited on the buffer structure at rates up to 22 Å/s. The sputtered cathode devices were identical in performance to a control device having an evaporated cathode. It was thus concluded that the buffer structure provided complete protection from sputter damage.

Although efficient devices based on sputtered cathode were disclosed, the use of a metal phthalocyanine, e.g. CuPc, and an alloy target appear undesirable. The CuPc in the device structure absorbs in the yellow/red wavelength range, and can exhibit color shifts. It will be highly desirable to replace CuPc with a transparent buffer. The cathode was fabricated using an alloy target that contains an alkali metal e.g., Li. With this approach the target itself is the source of the electron-injecting dopant. Due to dissimilar properties, particularly with respect to melting point, vapor pressure and other properties of alkali metals and other component metals, fabrication of homogeneous and quality target can be quite difficult. It is desirable to use pure metal, as high quality targets are readily available.

P. K. Raychaudhuri and J. K. Madathil, "Fabrication of Sputtered Cathodes for Organic Light-Emitting Diodes Using Transparent Buffer", Proceedings of the 7th Asian Symposium on Information Display (Sep. 2-4, Singapore) Digest, paper 50, Vol. 32, pp. 55-58, 2002 report sputtered cathode devices using transparent buffer, only several nanometers thick, and pure metal targets. The buffer layer is comprised of a fluoride of a heavy alkali metal upon which a metal such as Al or Mg was sputtered. These metals are reactive to alkali metal fluoride, and liberate an electron-injecting dopant by decomposing the fluoride. High efficiency devices, indistinguishable from evaporated cathode devices, were made by depositing the cathode by sputtering. However, in this case the thickness of buffer layer is to be carefully optimized so as not to leave excess unreacted buffer and to reduce build up of insulating reaction products at the ETL/cathode interface. In addition, the handling of alkali metal fluorides is difficult owing to their hygroscopic nature. Furthermore, the cathode metals are believed limited to those, which are reactive to the buffer layer.

A buffer layer of appropriate properties appears necessary in the device structure in a high speed sputtering process for the OLED cathode. A buffer layer should be robust and resistant to plasma, and should be able to protect the underlying organic layers from plasma damage. In addition, the buffer layer should permit the charge transport from the cathode to the ETL. If evaporable using low energy deposition process, metallic layers seem appropriate as a buffer. Since vacuum deposited Al is an electrode in the widely used LiF/Al cathode, the Al layer itself can be considered as a buffer layer upon which an additional layer of a protective metal or an alloy can be sputtered. This additional layer can be termed as a protective cathode layer or simply a protective layer. Al being reasonably resistant to atmospheric condition can also be useful as a protective cathode material. It has been found however, that even a moderately thick Al layer of the LiF/Al cathode fails to provide protection to the EL medium from sputter damage during sputtering of the Al protective cathode. Moreover, the sputtering process, which uses materials efficiently, and yields dense, conformal and adherent coatings with greatly reduced pinhole density, is desirable in large-scale manufacturing.

SUMMARY OF THE INVENTION

It is therefore an object of the present invention to provide an improved cathode structure for an OLED.

It is another object of the present invention to provide a method of making a cathode structure which makes use of sputtering.

These objects are achieved by a method of making a cathode structure for an OLED provided over organic layers, comprising:

a) evaporating a first layer over the organic layers, such layer including a metal or metal alloy whose work function is less that 4.0 eV, or a material including an electron-injecting dopant and a reactive metal;

b) depositing at least one second layer of an inorganic material over the first layer to form a buffer structure with the first layer; and c) sputtering a protective layer of a metal or metal alloy provided over the buffer structure.

The present invention makes use of sputtering to form most of the cathode structure. In accordance with the present invention, the sputtering processes are used for the fabrication of thick protective layers with improved resistance to moisture and oxygen ingress while preserving device performance and conserving materials and reducing cycle time in the manufacturing process.

DETAILED DESCRIPTION OF THE INVENTION

Throughout the following description, acronyms are used to designate the names of different layers and operating features of organic light-emitting diode devices. For reference, they are listed in Table 1.

TABLE 1

| | |
|---|---|
| OLED | Organic light-emitting diode |
| ITO | Indium tin oxide |
| HIL | Hole-injection layer |
| HTL | Hole-transport layer |
| EML | Emissive layer |
| ETL | Electron-transport layer |
| NPB | 4,4'-Bis[N-(1-naphthyl)-N-phenylamino]biphenyl (NPB) |
| Alq | Tris(8-hydroxyquinoline) aluminum |
| LiF | Lithium Fluoride |

TABLE 1-continued

| | |
|---|---|
| $MoO_x$ (0 < x < 3) | Molybdenum oxide |
| $WO_x$ (0 < x < 3) | Tungsten oxide |
| Mg | Magnesium |
| Ag | Silver |
| Al | Aluminum |

Figure 1:
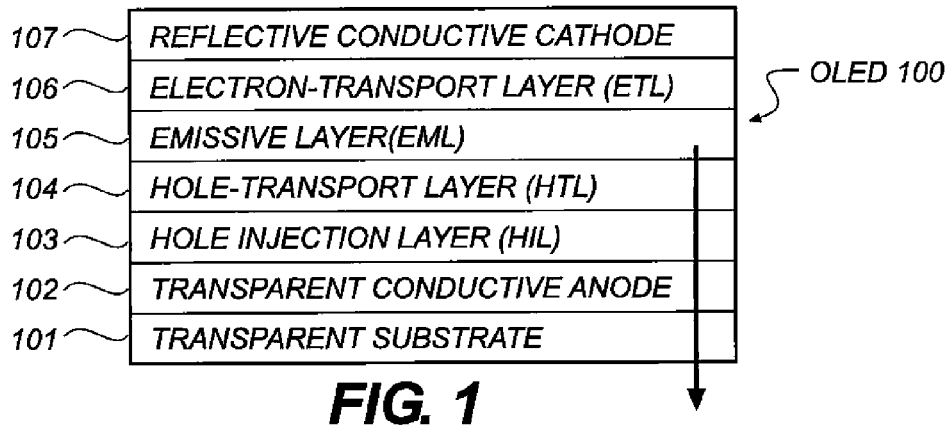
FIG. 1 shows schematically in cross-section the layered structure of a prior art OLED device.

Turning now to FIG. 1, the OLED 100 is a prior art device which includes a transparent substrate 101, a transparent and conductive anode 102, a hole-injection layer (HIL) 103, a hole-transport layer (HTL) 104, an emissive layer (EML) 105, an electron-transport layer (ETL) 106, and a reflective opaque and conductive cathode 107. The cathode 107 includes a metal of work function less than 4.0 eV. For example, the layer 107 can comprise an alloy of Mg such as MgAg. Alternately, the layer 107 can comprise a material including an electron-injecting dopant and a reactive metal such as Al or Mg. In a particular example, the cathode includes a layer of Al on an ultra thin layer of LiF. The layer 107 is thick and is deposited in entirety by evaporation. In operation, the anode 102 and the cathode 107 are connected to a voltage source and electrical current is passed through the organic layers, resulting in light generation in the emissive layer 105. A part of the generated light is emitted through the anode 102 and the substrate 101 in the direction shown by the arrow. The intensity of generated light is dependent on the magnitude of the electrical current passed through the OLED 100, which in turn is dependent on the luminescent and electrical characteristics of the organic layers as well as the charge-injecting natures of the anode 102, hole-injection layer 103, and cathode 107. The emission viewable is further dependent on the transmittance of the anode 102 and reflectance of the cathode 107 and the layer structure of the OLED 100.

Figure 2:
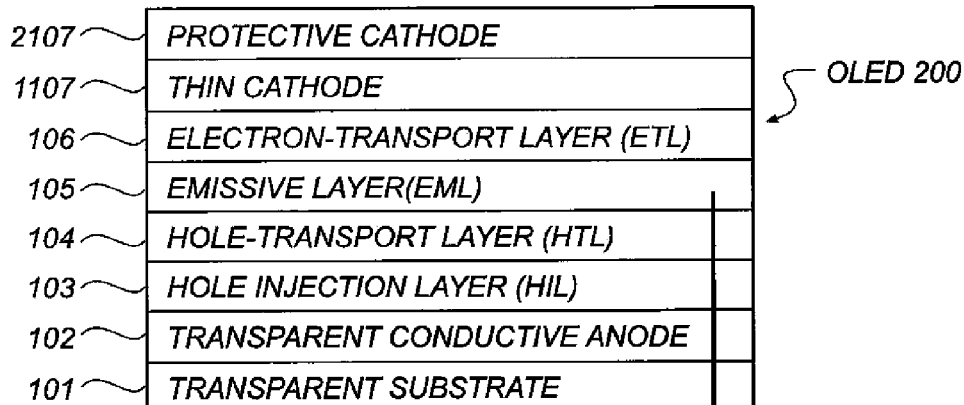
FIG. 2 shows schematically in cross-section the layered structure of a prior art OLED device wherein the cathode structure is partly fabricated by sputtering.

In FIG. 2 an OLED 200, which is structurally comparable to the device 100, is shown. The cathode 1107, however, is significantly thinner than the cathode 107 of FIG. 1. The thickness of the layer 1107 preferably ranges from 1 to 20 nm. A layer 2107, at least 50 nm thick, and substantially thicker than the layer 1107, is deposited over the thin cathode layer 1107 by sputtering. The layer 1107, which is the first layer over the organics, is conveniently termed as the first layer, which also serves as a buffer layer for deposition of the layer 2107. For convenience the layer 2107 is termed as the protective cathode layer or simply the protective layer. The devices having such structure are referred to as the sputtered cathode devices or sputtered cells. The composition of the protective layer 2107 can be identical to or different from that of the layer 1107. But the physical characteristics and its resistance to moisture and oxygen ingress should be superior to those of the evaporated cathode 107 or 1107. The layer 2107 should preferably include an environmentally stable metal such as Al. It has been found, however, that sputtering Al to form the layer 2107 causes degradation of device performance. This is believed to originate from sputtering damage. Thin cathode 1107, comprising relatively thick (50 nm) Al layer was found not to provide significant protection from sputtering damage. The surface conductivity of 50 nm thick Al layer is less than 1 ohm/sq, and its reflectivity is close to that of most of the Al. Thus, except for the fact that the layer 1107 by itself is not adequately protective against ingress of moisture and oxygen, the layer 1107 can function as an efficient cathode. Thus, there is a need for the layer 2107. The layer 2107 can include other metals such as Al, Cr, Ni, Sn, Pt, Au, Zn, Ti, Zr, Hf, V, Nb, Ta, Mo, Ge, Si, or stainless steels or mixtures or alloys thereof can constitute the layer 2107. The thickness of the layer should be at least 50 nm and preferably in the range of 200 to 900 nm.

Figure 3:
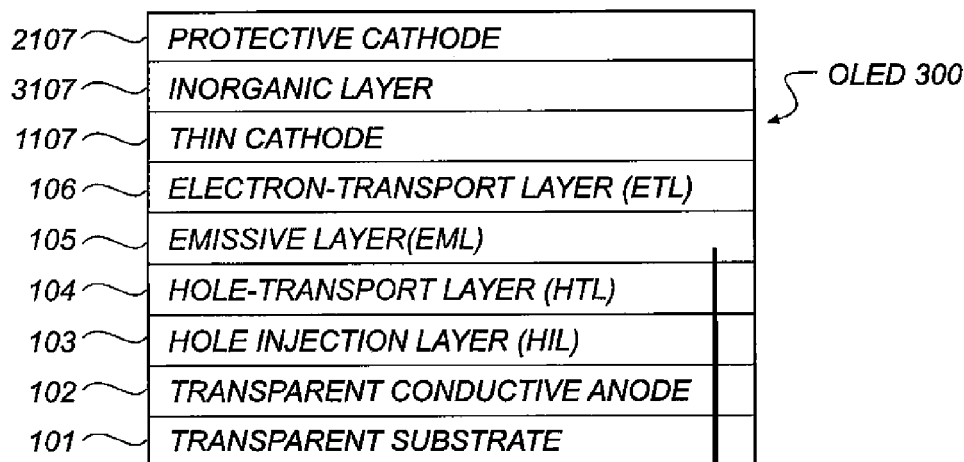
FIG. 3 shows schematically in cross-section the layered structure of the OLED device according to the present invention.

FIG. 3 is an OLED of the present invention. In this embodiment, OLED 300, a layer 3107 of an inorganic material, is provided over the thin cathode 1107. The inorganic layer 3107, which is conveniently termed as the second layer, also acts as a buffer during sputtering deposition of the protective layer 2107. The buffer layer 3107 is comprised of materials that are robust, resistant to plasma, and are able to protect the underlying layers including the organic layers from damage during sputtering deposition of the layer 2107. For convenience, the multilayer structure comprising the first layer 1107, the second layer 3107, and the protective layer 2107 is termed as the cathode structure. The thickness of the cathode structure can range from 55 to 900 nm. The first layer 1107 can be effective in reducing sputter damage, and the second layer 3107, in combination with the first layer 1107, virtually limits the sputter damage. The first layer 1107 and the second layer 3107 comprise the buffer structure. The second layer 3107 includes inorganic material that should preferably be evaporable and conductive. If the second layer 3107 is conductive, the protective layer 2107 is connected to the negative terminal of a power supply. If the second layer 3107 is non-conductive, the negative terminal of the power supply should be connected to the thin cathode 1107. The second layer 3107 includes metal, metal alloy, metal oxide, metal nitride, metal carbide, metal boride, or metal silicide, or mixtures thereof. The second layer 3107 comprising heavy metals or alloys of heavy metals can be particularly effective. By heavy metal it is meant those metals whose atomic weights are greater than 47.87, the atomic weight of Ti. Ag is a preferred metal buffer; it can be evaporated readily and, because of its high sputtering yield, can also be deposited by sputtering on the thin cathode layer 1107 using low power and with minimum damage to the organic layers. Other appropriate metal buffers having high sputtering yield include Ag, Au, Bi, Cd, Cu, Ni, Pb, Pd, Sb, or Zn or alloys thereof. Depending on the materials, the thickness of the second layer 3107 can be in the range of 5 to 50 nm. An advantage of efficient buffer is that it permits the use of very thin cathode and permits the sputtering of thick protective cathode at high rates, simplifying process and conserving materials.

The composition and the function of the various layers constituting the OLED device 100, 200, and 300 are described as follows.

Substrate 101 can include glass, ceramic, or plastics. Since the OLED device fabrication does not require high temperature process, any substrate that can withstand process temperatures in the order of 100° C. is useful, which includes most thermal plastics. The substrate 101 can take the form of rigid plate, flexible sheet, or curved surfaces. Substrate 101 can include support with electronic backplane, and thus includes active-matrix substrates, which contain electronic addressing and switching elements. Examples of such active-matrix substrates include substrates with high temperature polysilicon thin-film-transistors, and substrates with low temperature polysilicon, or amorphous silicon thin-film-transistors. Those skilled in the art will appreciate that other circuit elements can be used to address and drive the OLED devices.

Anode 102 provides the function of injecting hole into the organic layer when a positive potential relative to the cathode 107 is applied to the OLED device 100, or when a positive potential relative to the cathode 1107 is applied to the OLED device 200 or 300. It has been shown, for example, in commonly assigned U.S. Pat. No. 4,720,432, that indium tin oxide (ITO) forms efficient anode because it has a relatively high work function. Since ITO film itself is transparent, ITO coated glass provides an excellent support for the fabrication of OLED devices. Other suitable anode materials include high work function metals such as Au, Pt, Pd, or alloys of these metals. These metal layers have to be thin and at least semitransparent to permit the light to pass through. Other metals can also be used as anodes if provided with a suitable hole-injection layer (P. K. Raychaudhuri, J. K. Madathil, Joel D. Shore, and Steven A. Van Slyke, "Performance Enhancement of Top- and Bottom-Emitting Organic Light-Emitting Devices Using Microcavity Structures" Proceeding of the 23$^{rd}$ International Display Research Conference, Phoenix, Ariz., USA, Sep. 15-19, 2003, p10).

Hole-injection layer (HIL) 103 provides the function of increasing the efficiency of the hole-injection from the anode 102 into the organic layers. It has been shown, for example in commonly assigned U.S. Pat. No. 4,885,211, that a porphorinic or phthalocyanine or derivatives thereof compound is useful as a hole-injection layer 103, resulting in increased luminance efficiency and operational stability. Other preferred HIL materials include $CF_x$, which is a fluorinated polymer deposited by plasma-assisted vapor deposition, wherein x is less than or equal to 3 and greater than 0.The method of preparation and the characteristics of $CF_x$ have been disclosed in commonly assigned U.S. Pat. No. 6,208,077.The other HIL materials that can be useful include oxides of molybdenum, vanadium and ruthenium ("Metal oxides as a hole-injecting layer for an organic electroluminescent device", S. Tokito, K. Noda and Y. Taga, J. Phys. D; Appl. Phys. 29, 2750 [1996]).

Hole-transport layer (HTL) 104 provides the function of transporting holes to the emissive layer (EML) 105. HTL materials include various classes of aromatic amines as disclosed in commonly assigned U.S. Pat. No. 4,720,432.A preferred class of HTL materials includes the tetraaryldiamines of:

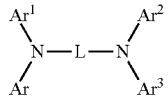

wherein:
Ar, $Ar^1$, $Ar^2$ and $Ar^3$ are independently selected from among phenyl, biphenyl, and naphthyl moieties;
L is a divalent naphthylene moiety or $d_n$;
d is a phenylene moiety;
n is an integer of from 1 to 4; and
at least one of Ar, $Ar^1$, $Ar^2$ and $Ar^3$ is a naphthyl moiety.

Useful selected (fused aromatic ring containing) aromatic tertiary amines are the following:
4,4'-Bis[N-(1-naphthyl)-N-phenylamino]biphenyl (NPB);
4,4''-Bis[N-(1-naphthyl)-N-phenylamino]-p-terphenyl;
4,4'-Bis[N-(2-naphthyl)-N-phenylamino]biphenyl;
1,5-Bis[N-(1-naphthyl)-N-phenylamino]naphthalene;
4,4'-Bis[N-(2-pyrenyl)-N-phenylamino]bi-phenyl;
4,4'-Bis[N-(2-perylenyl)-N-phenylamino]biphenyl;
2,6-Bis(di-p-tolylamino)naphthalene; and
2,6-Bis[di-(1-naphtyl)amino]naphthalene.

Emissive layer 105 provides the function of light emission produced as a result of recombination of holes and electrons in this layer. A preferred embodiment of the emissive layer includes a host material doped with one or more fluorescent dyes. Using this host-dopant composition, highly efficient OLED devices can be constructed. Simultaneously, the color of the EL devices can be tuned by using fluorescent dyes of different emission wavelengths in a common host material. Tang et al. in commonly assigned U.S. Pat. No. 4,769,292 describe this dopant scheme in considerable detail for OLED devices using Alq as the host material. As set forth in the Tang et al. commonly assigned U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene, 9,10 dianthryl anthracene, and alkyl substituted 9,10 dinaphthyl anthracene, as disclosed in Shi et al. commonly assigned U.S. Pat. No. 5,935,721.

Dopant materials include most fluorescent and phosphorescent dyes and pigments. Preferred dopant materials include coumarins such as coumarin 6, dicyanomethylenepyrans such as 4-dicyanomethylene-4H pyrans, as disclosed in Tang et al. commonly assigned U.S. Pat. No. 4,769, 292 and in Chen et al. in commonly assigned U.S. Pat. No. 6,020,078.

Electron-transport layer 106 provides the function of delivering electrons injected from the cathode to emissive layer 105. Useful materials include Alq, benzazoles, as disclosed in commonly assigned Shi et al. commonly assigned U.S. Pat. No. 5,645,948.

Cathode 107 of FIG. 1 is a fully reflective and conductive layer, several tens of nanometer thick, and comprised of materials including metals and alloys capable of efficiently injecting electron to the ETL 106 of FIG. 1. A metal or an alloy layer of a low work metal, such as MgAg, is an efficient cathode. Alternatively, a cathode comprising a reactive metal layer on an ultrathin layer of an electron-injecting dopant source provides efficient electron injection. LiF/Al is a widely used cathode. Cathode 1107 of FIG. 2 or FIG. 3 is also a reflective and conductive layer. The cathode 1107 can be different from or identical to that of the cathode 107 in composition, but the cathode 1107 is significantly thin compared to the cathode 107. The cathode layer is fabricated by vacuum evaporation process. The layer 2107, which is termed as the protective cathode, is a thick layer deposited by sputtering over the layer 1107. The thickness of the layer 2107 can range from 50 to 900 nm. The layer 2107 can comprise Al or other materials resistant to moisture and oxygen ingress. The layer 2107, which is deposited by sputtering, is likely to be dense having reduced pinholes and other defects. The fabrication of the protective cathode layer by sputtering further permits efficient use of materials and shortened deposition time. However, it has been determined in the present invention that the layer 2107 can not be sputtered at rates greater than 0.5 nm/s on the layer 1107 when the layer 1107 includes Al and its thickness is about 50 nm or less without damaging the device.

It has been discovered that when a layer of an inorganic material is provided over the layer 1107, sputtering deposition of the protective cathode can be done without compromising device performance. The inorganic layer 3107 and the cathode layer 1107 comprise the buffer structure which provides the function of controlling sputter damage during deposition of the protective cathode 2107 (FIG. 3) and thereby preserves or enhances the performance of OLED device 300. The layer 3107 includes heavy metals or alloys of heavy metals, oxides, nitrides, borides, silicides, or carbides. The preferred range of thickness for the buffer layer 3107 of FIG. 3 is 5 to 50 nm.

EXAMPLES

In the following examples, reference should be made to Table 1 for the appropriate structure and operating parameters corresponding to the listed acronym. The devices were fabricated using glass substrates having a 42 nm thick, 70 ohm/sq patterned ITO layer. After routine cleaning, a layer of 1 nm thick $CF_x$ (x<3.0) hole injection layer (HIL) was deposited on the ITO surface by decomposing $CHF_3$ gas in RF plasma. The substrates were then transferred to a vacuum coater operating at a pressure of ~1×10$^{-6}$ Torr, where the organic stack including a hole-transport layer (HTL) and a Alq emission/electron-transport layer (EML/ETL) were deposited in sequence at 0.4 nm/s through a mask having a 1.7 cm diameter circular aperture. A batch of these coated substrates were transferred to a multifunction deposition system, and placed on a carousel type stage so that all these devices can be made in the same run. The multifunction coater was equipped with evaporation boats, e-beam hearths, and several 2-inch diameter DC sputter guns. During transfer from the vacuum coater to the multifunction coater, the samples were briefly exposed to room atmosphere. To fabricate an all-vacuum-deposited control device, a layer of 0.5 nm thick LiF was deposited at 0.1 nm/s through the circular mask on the Alq ETL layer. A layer of Al layer, typically 100 nm thick, was deposited on the LiF layer by electron-beam heating at 1 nm/s through a square mask, which defined an active area of 0.1 cm$^2$ for the device. For devices of the present invention, a thin layer of Al, several nanometers thick, was deposited on the LiF layer by e-beam evaporation at 0.2 to 0.5 nm/s. The suitability of thin Al layer as a buffer was investigated. Other buffer layers were either evaporated or sputtered on the thin Al layer over which thick Al layer was deposited at high rate by sputtering. For sputtering, the chamber was backfilled with pure Ar flowing at 30 SCCM (standard cubic centimeter per minute) to maintain a fixed pressure, typically 16 mT (milli-Torr). The target-to-substrate distance was 3 inch. The Al layer was sputtered under these conditions at about 1 nm/s through the same square mask. Finally, the devices were hermetically encapsulated in a glove box filled with dry nitrogen.

Unless otherwise stated, the luminance of the devices was determined using a Photo Research PR650 spectroradiometer as a function of current. The drive voltage V (volt) and luminance L (cd/m$^2$) given in the tables are those determined when a current corresponding to 20 mA/cm$^2$ was passed through the devices. The voltage drop caused by series resistance of the ITO layer was subtracted from the measured drive voltage in order to compare devices on the basis of their "true" drive voltage.

Example 1

Compiled in Table 2 are the cathode structure and performance of a control and a series of sputtered cathode devices. The ITO, HIL, HTL, and EML/ETL layers of devices 20 through 25 are identical. The NPB HTL, and Alq EML/ETL, 105 nm and 60 nm, respectively, were deposited in a single-pump-down run. The control cell 20 was provided with a standard cathode including a 100 nm thick evaporated Al layer on a 0.5 nm LiF layer on the Alq layer. The sputtered cells, device 21 through 25, have varying thickness of relatively thin Al layer also evaporated on 0.5 nm LiF layers. These thin Al layers were used to study the effectiveness of Al itself as a buffer against further deposition of thick protective cathode of Al by sputtering at a deposition rate of 0.8 nm/sec using DC power of 120 W. The sputtering parameters were kept identical for all sputtered devices.

TABLE 2

Cathode structure and performance of sputtered cathode cells having varying thicknesses of Al buffer layer in comparison to a control cell

| Device ID | Device type | Evaporated layer (nm) | Evaporated buffer (nm) | Sputtered layer (nm) | Drive voltage (v) | Efficiency (cd/A) |
|---|---|---|---|---|---|---|
| 20 | control | Al (100) | | | 6.1 | 3.07 |
| 21 | sputtered cathode | | Al (1) | Al (72) | 8.7 | 1.59 |
| 22 | sputtered cathode | | Al (5) | Al (72) | 7.8 | 2.21 |
| 23 | sputtered cathode | | Al (10) | Al (72) | 7.2 | 2.33 |
| 24 | sputtered cathode | | Al (15) | Al (72) | 6.9 | 2.50 |
| 25 | sputtered cathode | | Al (20) | Al (72) | 6.6 | 2.69 |

All sputtered cathode devices exhibit higher drive voltage and lower efficiency compared to the control device 20. The control device is assumed to have suffered no damage during deposition of cathode as the entire Al layer was deposited by evaporation. It can be readily seen that, on increasing the Al buffer layer thickness, the drive voltage is progressively lowered with concomitant increase in efficiency suggesting increased sputter protection with increasing buffer thickness. The drive voltage of device 25 having the thickest buffer layer, however, still has higher drive voltage and only 88% luminance when compared with the control device 20. This suggests that 20 nm thick Al has not provided complete protection from sputtering damage during deposition of the protective cathode.

Example 2

Compiled in Table 3 are the cathode structure and performance of a control and two sputtered cathode devices. The ITO, HIL, HTL, and EML/ETL layers of devices 30 through 32 are identical. The NPB HTL, and Alq EML/ETL, 105 nm and 60 nm respectively, were deposited in a single-pump-down run. The control cell, device 30, was provided with a standard cathode including a 100 nm thick evaporated Al layer on a 0.5 nm LiF layer on the Alq layer. The sputtered cells, device 31 and 32, have 50 nm thick Al layers also evaporated on 0.5 nm LiF layers. These Al layers were used to study the effectiveness of Al as buffer layers against further deposition by sputtering of thick Al layer as a protective cathode. The deposition rate of Al was 0.8 nm/sec using DC power of 120 W. The device 32 has a thicker protective cathode compared to the device 31, and was fabricated by extending the deposition time. The other sputtering parameters were kept identical. The data of Table 3 show that sputtering 72 nm Al on the 50 nm thick Al buffer did not limit sputter damage, as the drive voltage was significantly higher than that of the control cell, and the luminance of the sputtered device 31 was only 74% of that of that of the control cell, device 30. The data also show that the longer deposition time to fabricate thicker layer of sputtered Al as in the device 32 using the same buffer caused further damage, as evidenced by further reduction of luminance efficiency and increase of drive voltage. The data of Table 3 show that 50 nm thick Al is unable to provide complete protection from sputtering damage. The 50 nm thick Al is effectively opaque, fully reflective, and the surface conductivity is less than 1.0 ohm/sq. Use of still thicker Al as buffer to limit sputter damage is not beneficial as the advantage of sputtering deposition of protective cathode will be greatly reduced.

TABLE 3

Cathode structure and performance a control cell and sputtered cathode cells having varying sputtered Al thickness on an evaporated Al buffer layer

| Device ID | Device type | Evaporated layer (nm) | Evaporated buffer (nm) | Sputtered layer (nm) | Drive voltage (v) | Efficiency (cd/A) |
|---|---|---|---|---|---|---|
| 30 | control | Al (100) | | | 6.0 | 2.99 |
| 31 | sputtered cathode | | Al (50) | Al (72) | 7.3 | 2.21 |
| 32 | sputtered cathode | | Al (50) | Al (144) | 7.9 | 1.97 |

Example 3

Compiled in Table 4 are the cathode structure and performance of a control and a series of sputtered cathode devices. The ITO, HIL, HTL and EML/ETL layers of devices 40 through 45 are identical. The NPB HTL, and Alq EML/ETL, 105 nm and 60 nm, respectively, were deposited in a single-pump-down run. The control cell, device 40, was provided with a standard cathode including a 100 nm thick evaporated Al layer on a 0.5 nm LiF layer on the Alq layer. The sputtered cells, device 41 through 45, have varying thickness of the Al layer also evaporated on 0.5 nm LiF layers. These Al layers were used to study the effectiveness of Al as a buffer layer against deposition of thick Mg overlayer by sputtering at a deposition rate of 1.2 nm/sec using DC power of 80 W. All other sputtering parameters were kept identical. Mg sputtering permits high deposition rates at low power because of its high sputtering yield and is expected to be less damaging. The data, however, show that even with the thick 20 nm Al buffer, the device 45 has higher drive voltage and only 83% luminance when compared with the control device 40. This suggests that the 20 nm thick Al has not provided complete protection from the Mg sputtering damage.

Compiled in Table 5 are the cathode structure and performance of a control and a series of sputtered cathode devices. The ITO, HIL, HTL and EML/ETL layers of devices 50 through 54 are identical. The NPB HTL, and Alq EML/ETL, 105 nm and 60 nm, respectively, were deposited in a single-pump-down run. The control cell, device 50, was provided with a standard cathode including a 100 nm thick evaporated Al layer on a 0.5 nm LiF layer on the Alq layer. The device 51 has a 30 nm thick Al layer also evaporated on a 0.5 nm LiF layer. The devices 52 through 54 have varying thickness of evaporated $MoO_x$ buffer layer in addition to the 30 nm thick Al layer. For convenience, a multilayer buffer comprising at least two buffer layers is termed as the buffer structure. Thus, the sputtered cells, device 52 through 54, have the buffer structure comprising varying thickness of the $MoO_x$ buffer on an Al buffer layer the thickness of which is fixed at 30 nm. The data of Table 5 clearly show that the 30 nm thick single layer buffer of Al is not protective against damage during sputtering deposition of thick protective Al cathode layer. The data also show that a buffer structure having only 10 nm $MoO_x$ buffer layer on the 30 nm Al buffer greatly reduced the damage during sputtering deposition of the protective cathode. Increasing the $MoO_x$ buffer to 20 nm, as in the device 53, completely limited sputter damage as evidenced by its performance, which is virtually indistinguishable from that of the control device 50. It is concluded from the data for the device 54 that increasing $MoO_x$ thickness beyond 20 nm provides no further benefit but does not increase the drive voltage.

TABLE 4

Cathode structure and performance of sputtered cathode cells having varying thicknesses of Al buffer layer in comparison to a control cell

| Device ID | Device type | Evaporated layer (nm) | Evaporated buffer (nm) | Sputtered layer (nm) | Drive voltage (v) | Efficiency (cd/A) |
|---|---|---|---|---|---|---|
| 40 | control | Al (100) | | | 6.0 | 3.10 |
| 41 | sputtered cathode | | Al (1) | Mg (70) | 7.4 | 2.14 |
| 42 | sputtered cathode | | Al (5) | Mg (70) | 7.2 | 2.13 |
| 43 | sputtered cathode | | Al (10) | Mg (70) | 7.1 | 2.32 |
| 44 | sputtered cathode | | Al (15) | Mg (70) | 6.9 | 2.42 |
| 45 | sputtered cathode | | Al (20) | Mg (70) | 6.6 | 2.56 |

TABLE 5

Cathode structure and performance of sputtered cathode cells having a bilayer buffer in comparison to a control cell

| Device ID | Device type | Evaporated layer (nm) | Evaporated buffer 1 (nm) | Evaporated buffer 2 (nm) | Sputtered layer (nm) | Drive voltage (v) | Efficiency (cd/A) |
|---|---|---|---|---|---|---|---|
| 50 | control cell | Al (100) | | | | 6.0 | 3.41 |
| 51 | sputtered cathode | | Al (30) | | Al (130) | 7.8 | 2.31 |
| 52 | sputtered cathode | | Al (30) | $MoO_x$ (10) | Al (130) | 6.6 | 3.26 |
| 53 | sputtered cathode | | Al (30) | $MoO_x$ (20) | Al (130) | 5.8 | 3.50 |
| 54 | sputtered cathode | | Al (30) | $MoO_x$ (30) | Al (130) | 5.9 | 3.48 |

Compiled in Table 6 are the cathode structure and performance of a control and several sputtered cathode devices. The ITO, HIL, HTL and EML/ETL layers of devices 60 through 63 are identical. The NPB HTL, and Alq EML/ETL, 45 nm and 60 nm respectively, were deposited in a single-pump-down run. The control cell, 60, was provided with a standard cathode including a 100 nm thick evaporated Al layer on a 0.5 nm LiF layer on the Alq layer. The device 61 has a 30 nm thick Al buffer layer on a 0.5 nm LiF layer. An Mg overlayer, 90 nm thick, was sputtered over the Al buffer at 1 nm/s. The device 62 and 63 have evaporated $WO_x$ buffer layer in addition to the 30 nm thick Al buffer. Thus, sputtered cells, device 62 through 63, have a buffer structure comprising varying thickness of the $WO_x$ buffer on an Al buffer layer the thickness of which is fixed at 30 nm. The data of Table 5 clearly show that the 30 nm thick single layer buffer of Al is not protective against damage during sputtering deposition of thick Mg overlayer. The data also show that a buffer structure having only 5 nm $WO_x$ buffer layer in addition to the Al buffer, virtually limited the sputtering damage. Increasing the $WO_x$ buffer to 10 nm, as in the device 63, has not altered the efficiency or the drive voltage. The reason might be that the Mg sputtering is less damaging than the Al sputtering or the $WO_x$ and, because of its high molecular weight, is able to provide complete protection even when buffer layer is very thin.

TABLE 6

Cathode structure and performance of sputtered cathode devices having a bilayer buffer in comparison to a control cell (NPB 45 nm)

| Device ID | Device type | Evaporated layer (nm) | Evaporated buffer 1 (nm) | Evaporated buffer 2 (nm) | Sputtered layer (nm) | Drive voltage (v) | Efficiency (cd/A) |
|---|---|---|---|---|---|---|---|
| 60 | control | Al (100) | | | | 5.1 | 2.47 |
| 61 | sputtered cathode | | Al (30) | | Mg (90) | 5.6 | 2.25 |
| 62 | sputtered cathode | | Al (30) | $WO_x$ (5) | Mg (90) | 5.2 | 2.43 |
| 63 | sputtered cathode | | Al (30) | $WO_x$ (10) | Mg (90) | 5.1 | 2.43 |

Compiled in Table 7 are the cathode structure and performance of a control and several sputtered cathode devices. The ITO, HIL, HTL and EML/ETL layers of devices 70 through 72 are identical. The NPB HTL, and Alq EML/ETL, 105 nm and 60 nm respectively, were deposited in a single-pump-down run. The control cell, 70, was provided with a standard cathode including a 100 nm thick evaporated Al layer on a 0.5 nm LiF layer on the Alq layer. The device 71 has a buffer structure comprising a sputtered Mg layer on a 30 nm thick Al layer. A 70 nm thick protective Al cathode was sputtered on the Mg layer. The device performance was found severely degraded. The voltage increase and luminance decrease were 1.6 V and 18%, respectively, when compared with the device 70. Most of the damage is believed to originate from the Al sputtering based on the data for the Mg cathode device 61 (Table 6). For device 61, the sputtering of 90 nm Mg on the 30 nm Al caused the voltage to rise only by 0.5 volt, and the luminance to degrade only by 9%. Thus, even relatively thick Mg is not an effective buffer. This may be because of the low molecular weight of Mg. When the 70 nm thick Mg is replaced with a 30 nm thick evaporated $MoO_x$ layer, as in the device 72, the performance is virtually identical to that of the all vacuum evaporated cathode control device 70.

TABLE 7

Cathode structure and performance of sputtered cathode devices having a bilayer buffer in comparison to a control cell

| Device ID | Device type | Evaporated layer (nm) | Evaporated buffer 1 (nm) | Buffer 2 (nm) | Sputtered layer (nm) | Drive voltage (v) | Efficiency (cd/A) |
|---|---|---|---|---|---|---|---|
| 70 | control | Al (100) | | | | 6.0 | 2.99 |
| 71 | sputtered cathode | | Al (30) | sputtered Mg (70) | Al (72) | 7.6 | 2.15 |
| 72 | sputtered cathode | | Al (30) | evaporated $MoO_x$ (30) | Al (72) | 5.7 | 2.89 |

Compiled in Table 8 are the cathode structure and performance of a control and several sputtered cathode devices. The ITO, HIL, HTL and EML/ETL layers of devices 80 through 82 are identical. The NPB HTL, and Alq EML/ETL, 105 nm and 60 nm respectively, were deposited in a single-pump-down run. The control cell, 80, was provided with a standard cathode including a 100 nm thick evaporated Al layer on a 0.5 nm LiF layer on the Alq layer. The device 81 was provided with a 10 nm thick Al buffer layer, and the device 82 had a 30 nm thick Al buffer layer. On the Al buffer layer of the devices 81 and 82 was deposited by evaporation a 20 nm thick layer of Ag on which a 108 nm thick Al protective cathode layer was sputtered. The data of Table 8 show that the buffer structure comprising the 20 nm thick Ag and the 30 nm thick Al layer essentially limited sputter damage. The data of Table 8 also show that the buffer structure comprising the 20 nm thick Ag and the thin 10 nm Al layer was effective in drastically reducing the sputter damage. It is concluded that that Ag is effective as a buffer.

TABLE 8

Cathode structure and performance of sputtered cathode cells having a bilayer buffer in comparison to a control cell

| Device ID | Device type | Evaporated layer (nm) | Evaporated buffer 1 (nm) | Buffer 2 (nm) | Sputtered layer (nm) | Drive voltage (v) | Efficiency (cd/A) |
|---|---|---|---|---|---|---|---|
| 80 | control | Al (100) | | | | 5.7 | 2.91 |
| 81 | sputtered cathode | | Al (10) | evaporated Ag (20) | Al (108) | 6.3 | 2.83 |
| 82 | sputtered cathode | | Al (30) | evaporated Ag (20) | Al (108) | 6.1 | 2.98 |

Compiled in Table 9 are the cathode structure and performance of several control and sputtered cathode devices. The ITO, HIL, HTL and EML/ETL layers of devices 90 through 94 are identical. The NPB HTL, and Alq EML/ETL, 75 nm and 75 nm respectively, were deposited in a single-pump-down run. The control cell, device 90, was provided with a standard cathode including a 50 nm thick evaporated Al layer on a 0.5 nm LiF layer on the Alq layer. Another control cell 90A having a different cathode structure was made by evaporation in the same run. The device 90A has an ultrathin electron-injecting layer comprising a 0.5 nm thick LiF layer, a 1 nm thick Al layer, and a 60 nm thick evaporated overlayer of Ag. The luminance of the cells were measured using a Minolta chroma meter, model CS 100. The data of Table 9 show that both control devices having evaporated cathode structures are identical within uncertainty of experiments. Also compiled in Table 9 is the performance of devices having sputtered Ag overlayer on varying thickness of Al buffer layer on the 0.5 nm LiF layer. The data of Table 9 show that the devices 92, 93, and 94 are essentially identical to the control device 90A in drive voltage and luminance. Thus, the sputtering of Ag layer on 10 nm or thicker Al buffer layer caused no sputter damage. The data also show that even 5 nm thick Al buffer layer was effective in significantly reducing the sputter damage. This might be due to the fact that, because of the high sputtering yield, Ag can be deposited at high rates using low power, and thus reducing damage.

TABLE 9

Cathode structure and performance of sputtered cathode cells having varying thicknesses of Al buffer layer buffer in comparison to a control cell

| Device ID | Device type | Dopant layer (nm) | Evaporated layer (nm) | Evaporated layer (nm) | Sputtered layer (nm) | Drive voltage (v) | Efficiency (cd/A) |
|---|---|---|---|---|---|---|---|
| 90 | control cell 1 | LiF (0.5) | Al (50) | | | 6.9 | 2.41 |
| 90A | control cell 2 | LiF (0.5) | Al (1) | Ag (60) | | 6.6 | 2.33 |
| 91 | sputtered cathode | | Al (5) | | sputtered Ag (60) | 7.1 | 2.11 |
| 92 | sputtered cathode | | Al (10) | | sputtered Ag (60) | 6.8 | 2.31 |
| 93 | sputtered cathode | | Al (15) | | sputtered Ag (60) | 6.7 | 2.32 |
| 94 | sputtered cathode | | Al (20) | | sputtered Ag (60) | 6.6 | 2.35 |

It is seen from all the examples presented in Tables 2 through 9 that on an evaporated first layer of Al additional Al layer, as a protective cathode, cannot be sputtered without degrading the device performance. An evaporated Al cathode layer as thick as 50 nm was ineffective against sputtering of Al protective cathode, as seen for the device 32 (Table 3). Although with thicker Al buffer the damage is expected to be reduced, the benefit of sputtering the protective cathode with respect to material utilization will be reduced. It is concluded that at least another buffer in addition to the Al layer is needed. It is interpreted from the data of Table 7 that Mg, as thick as 70 nm, is also ineffective in stopping sputter structure. However, in accordance with the present invention, when a buffer structure comprising a thin Al layer and a thin layer of an oxide of molybdenum or a thin layer of an oxide of tungsten or mixtures thereof or a thin layer of Ag is used, a thick Al protective cathode layer can be sputter deposited without any degradation of device performance. With one buffer structure comprising the 30 nm thick Al and 20 nm thick $MoO_x$ layer the sputtering damage is limited (device 53, Table 5). It can also be seen that with a 20 nm thick Ag layer in combination with the same Al layer the sputtering of Al protective cathode can be carried out without any detectable loss of device performance as shown in device 82 in Table 8. The data of Table 9 suggest that Ag can be sputtered on thin Al layer without causing significant damage. Thus, one of the preferred fabrication processes would be to deposit very thin Al layer by evaporation followed by sputtering of thin Ag layer and then depositing the thick protective cathode of Al by sputtering. By depositing thick Al protective cathode by sputtering, the stability of the cathode can be improved, the performance can be preserved, and material can be used more efficiently.

The invention has been described in detail with particular reference to certain preferred embodiments thereof, but it will be understood that variations and modifications can be effected within the spirit and scope of the invention.

PARTS LISTS

100 organic light-emitting diode
101 transparent substrate
102 transparent conductive anode
103 hole-injection layer
104 hole-transport layer
105 emissive layer
106 electron-transport layer
107 reflective conductive cathode
1107 thin conductive cathode layer
200 organic light-emitting diode
2107 protective cathode layer
300 organic light-emitting diode
3107 inorganic layer

The invention claimed is:

1. A method of making a cathode structure for an OLED provided over organic layers, comprising:
   a) evaporating a first cathode layer over and in continuous contact with the organic layers, such layer including a metal or metal alloy whose work function is less than 4.0 eV, or a material including an electron-injecting dopant and a reactive metal;
   b) depositing by evaporation at least one buffer layer of an inorganic material over and in contact with the first cathode layer to from a buffer structure with the first cathode layer, such buffer layer including an elemental heavy metal or a metal oxide, wherein the elemental heavy metal includes Ag, Au, Bi, Cd, Cu, Ni, Pd, Sb, Zn or alloys thereof; and
   c) sputtering a second cathode layer of an elemental metal or a mixture of elemental metals provided over the buffer structure;
   such that the at least one buffer layer prevents damage to the first cathode layer and organic layers during sputtering of the second cathode layer.

2. The method according to claim 1 wherein the deposition rate of the second cathode layer is greater than 0.5 nm/s.

3. The method according to claim 1 wherein the buffer layer includes oxides of molybdenum or tungsten or mixtures thereof as the metal oxide, or a thin layer of elemental Ag as the elemental heavy metal.

4. The method according to claim 1 wherein the second cathode layer includes elemental Al, Cr, Ni, Sn, Pt, Au, Zn, Ti, Zr, Hf, V, Nb, Ta, Mo, Ge, or mixtures thereof.

5. The method according to claim 1 wherein the thickness of the first cathode layer is greater then 1 nm and less than 20 nm.

6. The method according to claim 1 wherein the thickness of the buffer layer is greater than 5 nm and less than 50 nm.

7. The method according to claim 1 wherein the thickness of the second cathode layer is greater than 50 nm.

8. The method according to claim 1 wherein the thickness of the cathode structure is in a range of 55 nm to 900 nm.

9. The method according to claim 1 wherein the OLED organic layer includes an emissive layer.

10. The method according to claim 9 wherein the emissive layer includes a host and one or more light-emitting doped materials.

* * * * *